United States Patent
Sato

(10) Patent No.: US 8,169,829 B2
(45) Date of Patent: May 1, 2012

(54) MEMORY CONTROLLER, MEMORY SYSTEM, RECORDING AND REPRODUCING METHOD FOR MEMORY SYSTEM, AND RECORDING APPARATUS

(75) Inventor: Takeaki Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/082,981

(22) Filed: Apr. 8, 2011

(65) Prior Publication Data

US 2011/0191552 A1     Aug. 4, 2011

Related U.S. Application Data

(63) Continuation of application No. 12/390,632, filed on Feb. 23, 2009, now Pat. No. 7,936,609.

(30) Foreign Application Priority Data

Jul. 22, 2008   (JP) ................. 2008-188893

(51) Int. Cl.
    G11C 11/34    (2006.01)
    G11C 16/04    (2006.01)
    G11C 16/06    (2006.01)
    G11C 8/00     (2006.01)

(52) U.S. Cl. ......... 365/185.18; 365/185.23; 365/185.24; 365/236

(58) Field of Classification Search ............. 365/185.18, 365/185.23, 185.24
    See application file for complete search history.

(56) References Cited

U.S. PATENT DOCUMENTS

| | | | |
|---|---|---|---|
| 6,288,935 | B1 | 9/2001 | Shibata et al. |
| 2005/0078519 | A1 | 4/2005 | Shiga |
| 2006/0259716 | A1 | 11/2006 | Moschopoulos |
| 2006/0290542 | A1* | 12/2006 | Liu ................... 341/51 |
| 2008/0101131 | A1 | 5/2008 | Lee et al. |
| 2009/0172496 | A1* | 7/2009 | Roine ............... 714/758 |

FOREIGN PATENT DOCUMENTS

JP     2001-93288    4/2001

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A memory system has a memory unit that is made of memory cells, each of which assumes a record state with a threshold voltage according to data. If an inverter has performed reverse processing on a data sequence so as to make the number of the memory cells in a predetermined record state great based on a count of a counter in a record operation, the memory system sets a flag added to the data sequence to indicate that the reverse processing has been performed, and performs re-reverse processing on the data sequence to which the flag indicating that the inverter has performed the reverse processing is added in a reproducing operation.

4 Claims, 8 Drawing Sheets

FIG.5

INPUT DATA    1 1 0 0 1 0 0 0 1 0 0 1 1 0 1 0 0 0 1 0 0 0 1 1 0 1 0 1

REVERSED DATA 0 0 1 1 0 1 1 1 0 1 1 0 0 1 0 1 1 1 0 1 1 1 0 0 1 0 1 0

FLAG          1

RECORDED DATA 0 0 1 1 0 1 1 1 0 1 1 0 0 1 0 1 1 1 0 1 1 1 0 0 1 0 1 0 1

OUTPUT DATA   1 1 0 0 1 0 0 0 1 0 0 1 1 0 1 0 0 0 1 0 0 0 1 1 0 1 0 1

FIG.6

INPUT DATA    0 0 1 1 0 1 1 1 0 1 1 0 0 1 0 1 1 1 0 1 1 1 0 0 1 0 1 0

RECORD DATA   0 0 1 1 0 1 1 1 0 1 1 0 0 1 0 1 1 1 0 1 1 1 0 0 1 0 1 0  0

RECORDED DATA 0 0 1 1 0 1 1 1 0 1 1 0 0 1 0 1 1 1 0 1 1 1 0 0 1 0 1 0 0

OUTPUT DATA   0 0 1 1 0 1 1 1 0 1 1 0 0 1 0 1 1 1 0 1 1 1 0 0 1 0 1 0

FIG.9

INPUT DATA
PAGE M DATA    0 0 1 0 0 1 0 1 0 0 1 0 0 0 0 1 1 0 0 0 1 0 0 0 1 0 0 0
PAGE N DATA    1 0 0 1 0 0 1 0 1 0 1 0 1 1 1 0 0 1 1 1 1 0 1 1 0 1 1 0

RECORD DATA    |0|0|1|0|0|1|0|1|0|0|1|0|0|0|0|1|1|0|0|0|1|0|0|0|1|0|0|0|
                      |1|0|0|1|0|0|1|0|1|0|1|0|1|1|1|0|0|1|1|1|1|0|1|1|0|1|1|0|

INPUT DATA
PAGE M DATA    0 0 1 0 0 1 0 1 0 0 1 0 0 0 0 1 1 0 0 0 1 0 0 0 1 0 0 0
PAGE N DATA    1 0 0 1 0 0 1 0 1 0 1 0 1 1 1 0 0 1 1 1 1 0 1 1 0 1 1 0

RECORD DATA
PAGE M DATA    1 1 0 1 1 0 1 0 1 1 0 1 1 1 1 0 0 1 1 1 0 1 1 1 0 1 1 1 _ 1
PAGE N DATA    1 0 0 1 0 0 1 0 1 0 1 0 1 1 1 0 0 1 1 1 1 0 1 1 0 1 1 0 _ 0

RECORDED DATA    |1|1|0|1|1|0|1|0|1|1|0|1|1|1|1|0|0|1|1|1|0|1|1|1|0|1|1|1|1|
                           |1|0|0|1|0|0|1|0|1|0|1|0|1|1|1|0|0|1|1|1|1|0|1|1|0|1|1|0|0|

OUTPUT DATA
PAGE M DATA    0 0 1 0 0 1 0 1 0 0 1 0 0 0 0 1 1 0 0 0 1 0 0 0 1 0 0 0
PAGE N DATA    1 0 0 1 0 0 1 0 1 0 1 0 1 1 1 0 0 1 1 1 1 0 1 1 0 1 1 0

MEMORY CONTROLLER, MEMORY SYSTEM, RECORDING AND REPRODUCING METHOD FOR MEMORY SYSTEM, AND RECORDING APPARATUS

CROSS REFERENCE TO RELATED APPLICATION

This application claims the benefit of Japanese Application No. 2008-188893 filed in Japan on Jul. 22, 2008; the contents of which are incorporated herein by this reference.

BACKGROUND OF THE INVENTION

1. Field of the Invention

The present invention relates to a memory controller, a memory system, a recording and reproducing method for the memory system, and a recording apparatus, more particularly, to a memory controller configured to control a memory system that records a data sequence in a memory unit including memory cells, each of which assumes a record state according to data and reproduces the recorded data sequence; a memory system; a recording and reproducing method for the memory system; and a recording apparatus.

2. Description of the Related Art

Memory systems, particularly memory systems configured to record data in an NAND-type flash memory, a non-volatile recording medium, have been developed. The memory systems have been widely used as memory devices of host devices in a personal computer, a mobile phone, a digital camera and the like, or build-in memory systems in the computer systems. Among others, recently, the memory systems having the NAND-type flash memory have been particularly widely used.

In a record operation, the NAND-type flash memory injects a predetermined amount of charge into a charge accumulation layer of a memory cell in a semiconductor memory unit through an insulating film according to data to be recorded. In a reproducing operation, the NAND-type flash memory measures a difference between threshold voltages of transistors according to the amounts of charge in the memory cells and reads out the recorded data. Here, the memory cells assume a plurality of record states with different threshold voltages. Corresponding data are determined for respective record states. In two-value memory cells, for example, a memory cell in a low threshold voltage state with no charge accumulated is determined as "1" data, while a memory cell in a high threshold voltage state with a charge accumulated is determined as "0" data.

The memory cell with no charge accumulated and the memory cell with a charge accumulated, in other words, the memory cells with different threshold voltages differ in their physical stable states. For the known memory systems, however, which type of data should correspond to one of the respective record states of the memory cell has not been considered.

Japanese Patent Application Laid-Open Publication No. 2001-93288 discloses a multivalued flash memory device capable of recording 2-bit data in one memory cell by using record states with four different threshold voltages. Japanese Patent Application Laid-Open Publication No. 2001-93288 also discloses that the multivalued flash memory device requires a longer time in accumulating a charge in a memory cell to a high threshold voltage state than in accumulating to a low threshold voltage state.

SUMMARY OF THE INVENTION

A memory controller according to an aspect of the present invention is a memory controller configured to control a memory system that records a data sequence in a semiconductor memory unit and reproduces the recorded data sequence, the semiconductor memory unit being made of memory cells, each of which assumes a record state with a threshold voltage according to data including, a counter configured to count the number of "0" data or "1" data in the data sequence; and an inverter configured to reverse all data in the data sequence; and a control unit configured to set a flag added to the data sequence to indicate that the reverse processing has performed if the inverter has performed reverse processing on the data sequence so as to make the number of the memory cells in a predetermined record state great or small based on a count of the counter in a record operation, and perform re-reverse processing on the data sequence to which the flag indicating that the inverter has performed the reverse processing is added in a reproducing operation.

The memory system according to an aspect of the present invention has the above-described memory controller and a semiconductor memory unit.

A recording and reproducing method for a memory system according to an aspect of the present invention is a recording and reproducing method for a memory system for recording a data sequence in a semiconductor memory unit and reproducing the recorded data sequence. The semiconductor memory unit is made of memory cells, each of which assumes a record state with a threshold voltage according to data. For a record operation, the recording and reproducing method includes: counting the number of "0" data or "1" data in the data sequence; performing reverse processing on the data sequence so as to make the number of the memory cells in a predetermined record state great or small based on a count counted in the counting; setting a flag added to the data sequence to indicate that reverse processing has been performed, if the reverse processing has been performed; and recording the data sequence and the flag in the semiconductor memory unit. For a reproducing operation, the recording and reproducing method includes: detecting a content of the flag; performing re-reverse processing on the data sequence, if the flag indicates that the reverse processing has been performed; and outputting the data sequence.

A recording apparatus according to an aspect of the present invention includes: a memory unit that is made of memory cells, each of which assumes a record state according to data; a counter configured to count the number of "0" data or "1" data in a data sequence, wherein the data sequence includes the data to be recorded in the memory unit; an inverter configured to reverse all data in the data sequence; and a control unit configured to set a flag added to the data sequence to indicate that reverse processing has been performed, if the inverter has performed the reverse processing on the data sequence so as to make the number of the memory cells in a predetermined record state great or small based on a count of the counter when the data sequence is recorded in the memory unit, and to control to perform re-reverse processing on the data sequence to which the flag indicating that the inverter has performed the reverse processing is added when the data sequence is reproduced.

BRIEF DESCRIPTION OF THE DRAWINGS

FIG. 5 is an explanatory drawing for illustrating a recording and reproducing method for the memory system according to the first embodiment of the present invention;

FIG. 6 is an explanatory drawing for illustrating a recording and reproducing method for the memory system according to the first embodiment of the present invention;

FIG. 9 is an explanatory drawing for illustrating a recording and reproducing method for the four-value record memory system; and FIG. 10 is an explanatory drawing for illustrating a recording and reproducing method for the memory system according to the second embodiment of the present invention.

DETAILED DESCRIPTION OF THE PREFERRED EMBODIMENTS

<First Embodiment>

Figure 1:
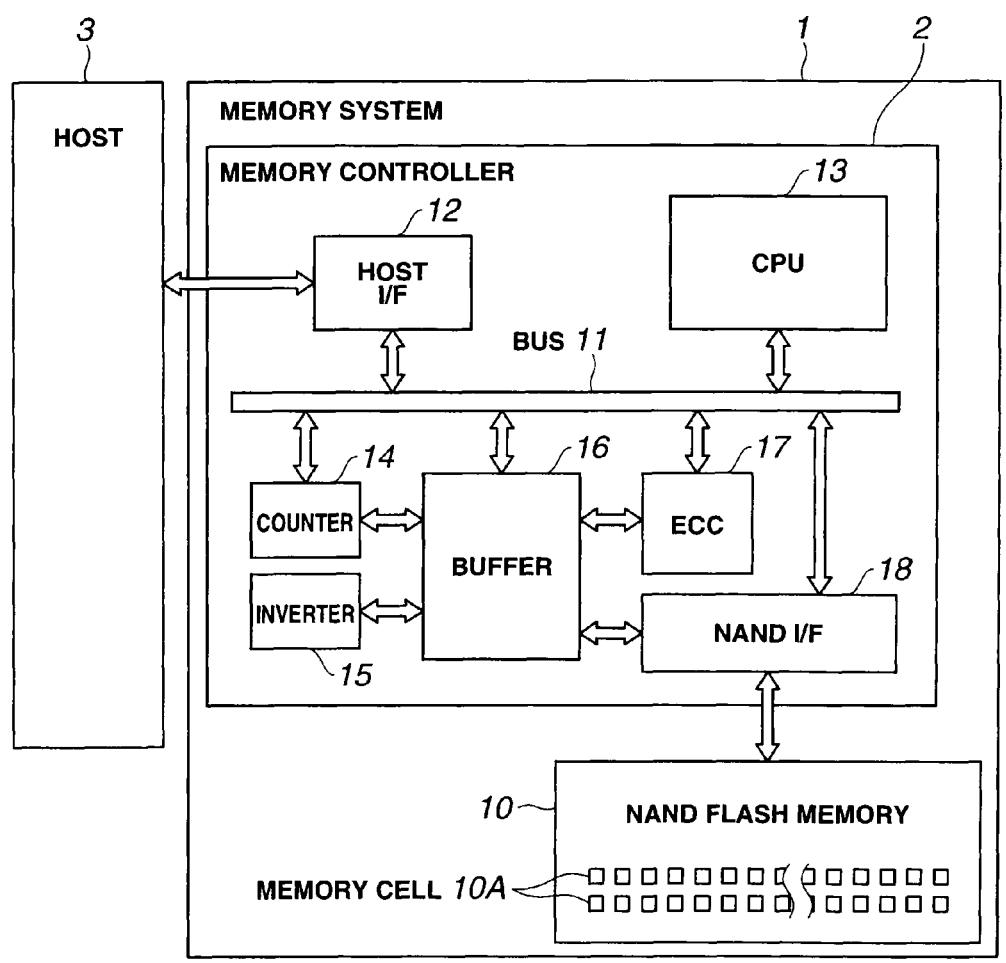
FIG. 1 is a diagram showing an outlined configuration of a memory system according to a first embodiment of the present invention.

A memory controller 2, a memory system 1, and a recording and reproducing method for the memory system according to a first embodiment of the present invention will be described below with reference to the drawings. FIG. 1 is a diagram showing an outlined configuration of the memory system 1 according to the embodiment.

First, the outlined configuration of the memory system 1 according to the embodiment of the present invention will be described with reference to FIG. 1. The memory system 1 is, for example, a NAND-type flash memory medium that records digital data including "0" data and "1" data received from a host 3 such as a personal computer and sends the recorded data to the host 3, an SSD (Solid State Disk) that is also used as a boot disk for the host 3, or the like.

As shown in FIG. 1, the memory system 1 includes a semiconductor memory unit (hereinafter, also referred to as "memory unit") 10, and the memory controller 2. The memory unit 10 and the memory controller 2 may be disposed on a single chip or on separate chips. The memory unit 10 includes an NAND-type flash memory, in which unit cells of a plurality of memory cells 10A are connected by a bit line or the like. In a record operation, the amounts of charge according to the data to be recorded are accumulated in the memory cells 10A and the memory cells 10A are set to the threshold voltages of transistors according to the data to be recorded.

The memory controller 2 uses a CPU 13, which is a control unit, to send and receive the data to and from the host 3 via a host I/F (interface) 12 and to send and receive the data to and from the memory unit 10 via an NAND I/F (interface) 18 through a buffer 16. An ECC (Error Correcting Code) circuit 17 of the memory controller 2 has an encoder configured to generate and add an error correcting code in a data record operation, and a decoder configured to decode the read out encoded data in a data read out operation (reproducing operation). The memory controller 2 processes user data from the host 3 as a predetermined length, for example, 1 KB length of data sequence. The CPU 13 and the like in the memory controller 2 are interconnected by a bus 11.

The memory controller 2 according to the embodiment has a counter 14 configured to count the number of the "0" data or the "1" data in the data sequence to be recorded. Since the data sequence includes two types of data, i.e., the "0" data and the "1" data, if the length of the data sequence is known, after the number of either the "0" data or the "1" data is counted, the number of the other data can be obtained. Therefore, the counter 14 counts the number of either the "0" data or the "1" data.

The memory controller 2 has an inverter 15 configured to reverse all data in the data sequence in the record and reproducing operations. The reverse processing on the data is replacing the "0" data by the "1" data and replacing the "1" data by the "0" data.

As described above, in the memory system 1, the memory cell 10A has the threshold voltage showing different record states according to whether the recorded data is the "0" data or the "1" data. That means that the memory cell in which the "0" data is recorded and the memory cell in which the "1" data is recorded have different performance. Here, the term 'performance' means at least either a speed or reliability of the memory system 1 in recording and reproducing the data.

Figure 2:
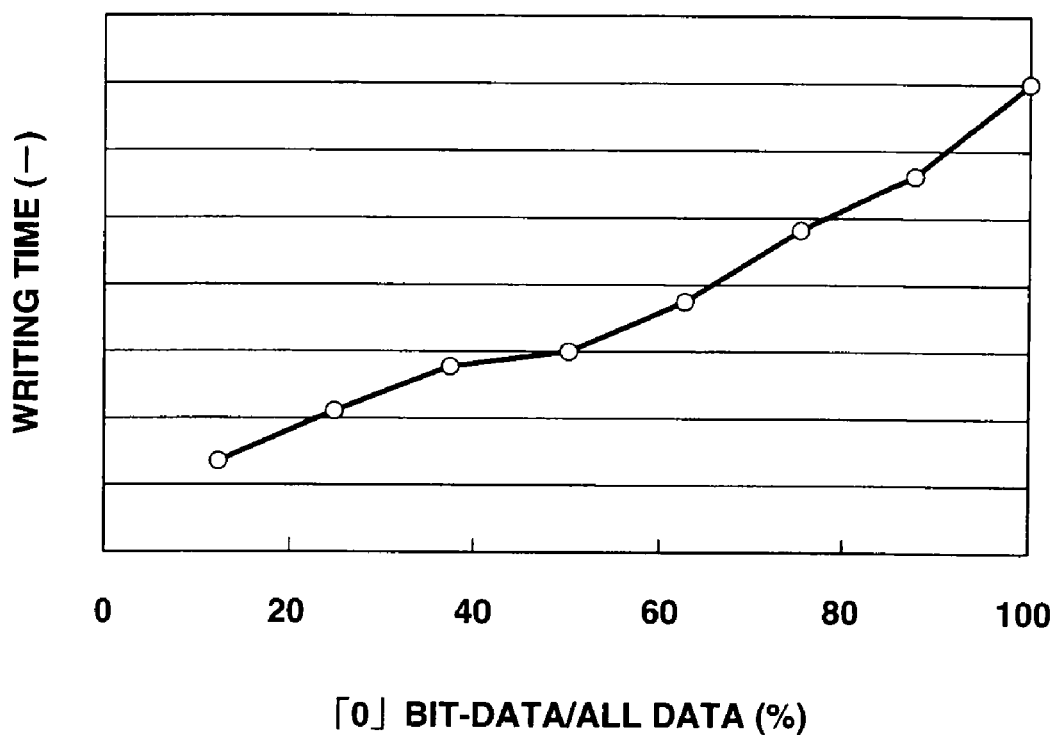
FIG. 2 is a graph plotting a time required for recording a data sequence against a proportion of data "0" in the data sequence in the memory system.

For example, as shown in FIG. 2, in the memory system 1, as a proportion of the data "0" ("0" bit) in the data sequence increases, a time required for recording the data sequence becomes longer. FIG. 2 is a graph plotting the time required for recording the data sequence against the proportion of the data "0" in the data sequence in the memory system.

FIG. 2 shows a case of the memory system 1 where the memory cell 10A in an erased state with a low threshold voltage corresponds to the data "1" and the memory cell 10A with a charge accumulated to a high threshold voltage corresponds to the data "0". When the data "0" is to be recorded in the memory cell 10A in the memory system 1, write processing for accumulating a charge in the memory cell 10A is required. For that reason, when the great number of the "0" data are in the data sequence to be written, a longer time is required for recording the data sequence than in the case where the small number of the "0" data are in the data sequence. In other words, when the great number of the "0" data are in the data sequence to be written, the recording speed is slower than in the case where the small number of the "0" data are in the data sequence.

In recording data, the memory controller 2 of the memory system 1 according to the embodiment, however, counts the number of data that makes the memory cell in a record state with a lower threshold voltage, i.e., the number of the "1" data by the counter 14 for each data sequence to be recorded, and performs reverse processing on the data sequence by the inverter 15 so that the data sequence is in a predetermined state of either having the great number of the memory cells in a record state with a lower threshold voltage or having the small number of the memory cells in a record state with a higher threshold voltage. When the inverter 15 has performed the reverse processing, the memory controller 2 sets a flag added to the data sequence to indicate that the reverse processing has been performed and records the data sequence subjected to the reverse processing and the flag in the memory unit 10.

Accordingly, the memory system 1 provides a faster recording speed and higher performance than the known memory system.

In a read out operation i.e., a reproducing operation of the data sequence, in the memory controller 2, the inverter 15 performs the re-reverse processing on the data sequence to which the flag indicating that the inverter 15 has performed the reverse processing added. In contrast, the memory controller 2 does not perform the re-reverse processing on the data sequence to which the flag indicating that the reverse processing has not been performed added.

Figure 3:
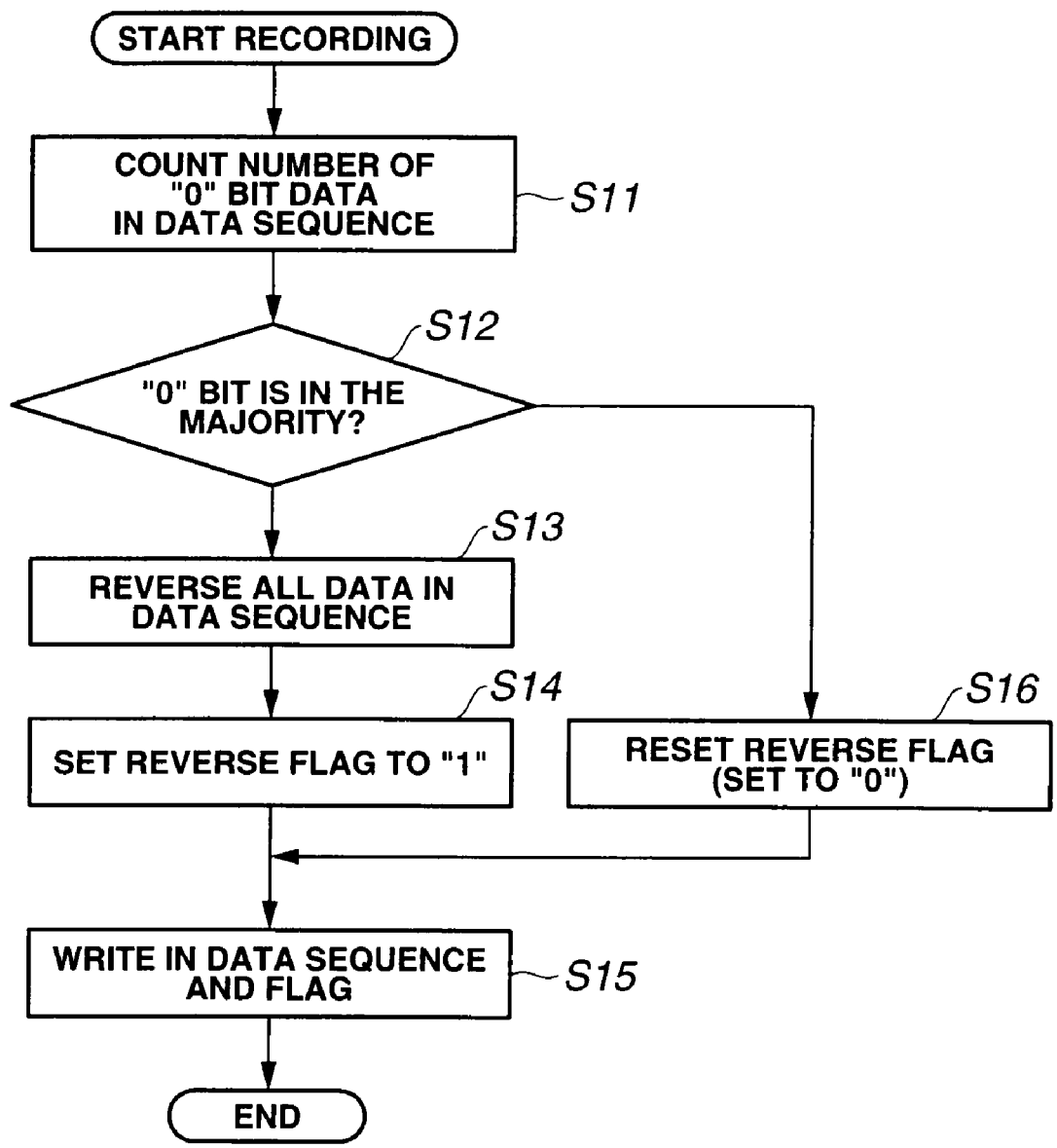
FIG. 3 is a flowchart for illustrating a recording method for the memory system according to the first embodiment of the present invention.
Figure 4:
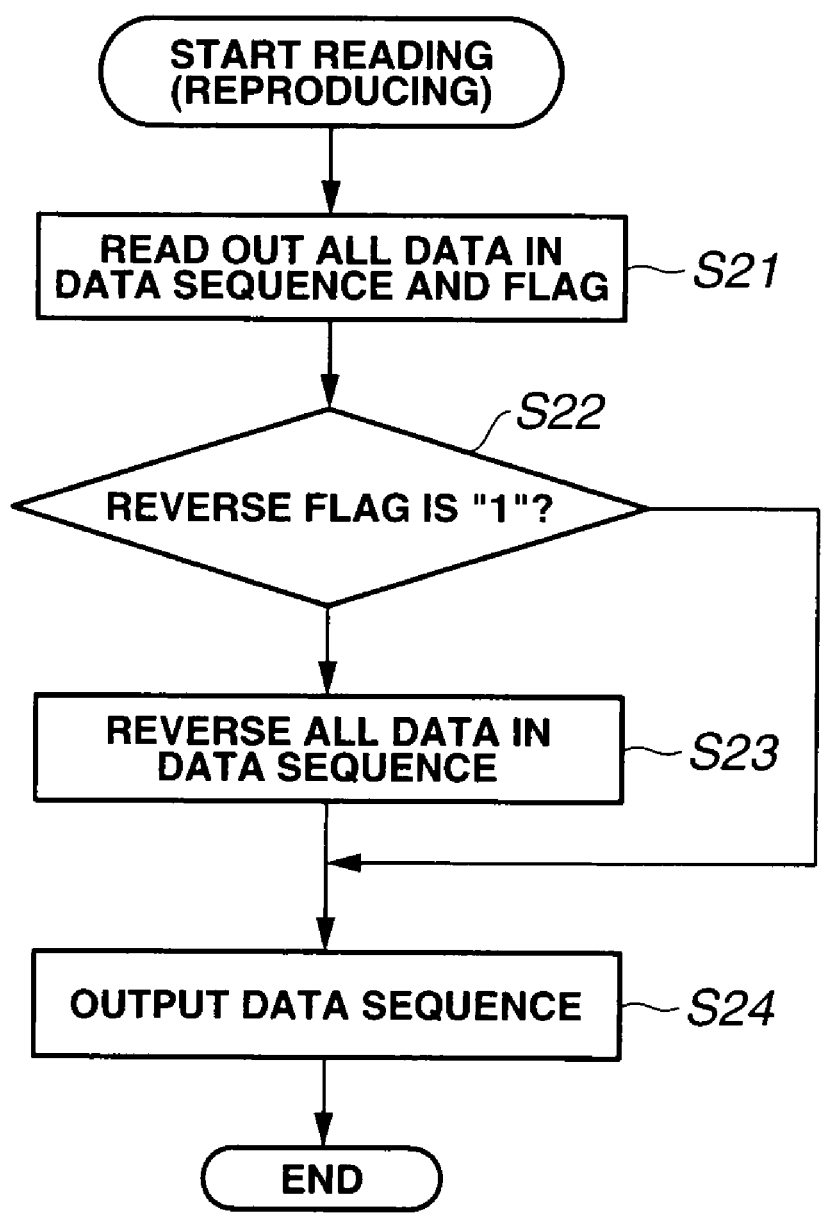
FIG. 4 is a flowchart for illustrating a reproducing method for the memory system according to the first embodiment of the present invention.

A recording method for the memory system 1 will be described in detail with reference to FIG. 3, FIG. 4, FIG. 5, and FIG. 6. FIG. 3 and FIG. 4 are flowcharts for illustrating the recording and reproducing method for the memory system 1 according to the embodiment. FIG. 5 and FIG. 6 are explanatory drawings for illustrating the recording and reproducing method on the data sequence of the memory system 1 according to the embodiment. The recording and reproducing method for the memory system 1 will be described below with reference to the flowchart shown in FIG. 3 and FIG. 4.

First, processing in the record operation will be described.

<Step S11> Counting Step

The data sequence sent from the host 3 is temporarily recorded in the buffer 16. The counter 14 counts the number of "1" data in the data sequence.

The 28-bit data sequence shown in FIG. 5 will be taken as an example. The counter 14 counts the number of "1" data in the 28-bit data sequence (Input Data) and sends the count to the CPU 13. For simplicity of the description, the length of the data sequence in the unit of writing data is as short as 28 bit in FIG. 5.

<Step S12> Determining Step

The CPU 13 determines whether or not to perform the reverse processing on the data sequence based on a predetermined condition. The predetermined condition may include following, for example. If the proportion of the "1" data that is to be in a predetermined record state in the data sequence indicates that the "1" data is below the majority, which is a predetermined proportion, i.e., if the "0" data in the data sequence is in the majority, the CPU 13 reverses the data sequence. The condition is defined by the proportion or the like of the number of the memory cells that are in a predetermined record state to the number of all the memory cells in the data sequence. The predetermined proportion is decided according to the specifications for the memory system as required.

As the 28-bit data sequence shown in FIG. 5 has the "0" data by the number of 16 and the "1" data by the number of 12, the "0" data is in the majority. When the condition requires that the "0" data is in the majority, the reverse processing is performed.

<Step S13> Reversing Step

If the proportion of the "0" data in the data sequence is in the majority, which is a predetermined proportion, the inverter 15 performs the reverse processing on the data sequence. That is, in the example shown in FIG. 5, the "Input Data" is converted to the "Reversed Data".

<Step S14> Flag Setting Step

If the reverse processing has been performed, the CPU 13 sets a flag added to the data sequence to "1" indicating that the reverse processing has been performed.

<Step S15> Recording Step

The CPU 13 records the data sequence that has been subjected to the reverse processing and the flag "1" indicating that the reverse processing has been performed in the memory unit 10. Here, it is apparent from FIG. 2, as the proportion of the memory cell that records "1" is in the majority, i.e., as the proportion of the memory cell that records "0" is in the minority as shown as "Recorded data" in FIG. 5, the CPU 13 can write the data sequence in a shorter time than the conventional art.

<Step S16>

If the number of the "0" data in the data sequence is determined as below the majority at step S12 as shown in FIG. 6, the inverter 15 does not perform the reverse processing on the data sequence. Then, at step S15 the CPU 13 resets the flag added to the data sequence to "0", i.e., records the "Record data" that has the flag added to the data sequence set to the flag "0" indicating that the reverse processing has not been performed in the memory unit 10 as shown in FIG. 6.

That is, the flag added to the data sequence is a reverse flag. The reverse flag "1" shows that the data sequence has been subjected to the reverse processing, while the reverse flag "0" shows that the data sequence has not been subjected to the reverse processing. As the reverse flag is important data, it is preferably added to the data sequence redundantly, for example twice or more times. The reverse flag may be recorded in a location other than the memory unit 10 separately from the data sequence.

Now, processing in the read out (reproducing) operation will be described.

<Step S21>

The data sequence read out from the memory unit 10 is temporarily recorded in the buffer 16.

<Step S22> Flag Detecting Step

The CPU 13 detects the content of the reverse flag added to the read out data sequence.

<Step S23> Re-Reversing Step

If the reverse flag is "1" at step S22, the inverter 15 performs a reverse processing on the data sequence to make the data sequence as "Re-reversed data" shown in FIG. 5. The reverse processing is re-reverse processing which recovers the original state of the data sequence that has been subjected to the reverse processing in the write operation.

<Step S24> Outputting Step

The memory controller 2 outputs the data sequence as shown in "Output data" in FIG. 5 and FIG. 6 to the host 3.

If the reverse flag is "0" at step S22, the inverter 15 does not perform a reverse processing.

As described above, the recording and reproducing method for the memory system according to the embodiment provides a faster recording speed and higher performance than the known memory system.

In a memory system, if the memory cell having recorded the data "0" has the accumulated charge reduced while the memory cell is retaining the data, the memory cell may be mistaken for the memory cell that records the data "1" with the low threshold voltage in the reproducing operation. For that reason, the memory system tends to be less reliable when the data "0", which gives the memory cell a poor data retaining property, is in the majority in the data sequence than when the "1" data, which gives the memory cell a good data retaining property, is in the majority.

But, when the memory controller 2 of the memory system 1 according to the embodiment performs the reverse processing on the data sequence in the record operation so that the memory cells of a predetermined proportion or more, for example the majority of the memory cells, are in the state of recording "1" data with no charge accumulated, the memory controller 2 of the memory system 1 adds the flag indicating that the reverse processing has been performed on the data sequence to the data sequence and records them in the memory unit. Then in the reproducing operation, the memory controller 2 performs the re-reverse processing on the data sequence with the flag indicating that the reverse processing has been performed added.

That makes the memory system 1 and the memory system having the memory controller 2 provide not only a faster recording speed but also higher reliability than the known memory system. The recording and reproducing method for the memory system according to the embodiment provides higher reliability than the recording and reproducing method for the known memory system does.

As described above, in the memory system 1, the memory controller 2 preferably performs the reverse processing on the data sequence so as to make the majority of the memory cells in the record state with the low threshold voltage or to make the minority of the memory cells in the record state with the high threshold voltage. If the memory cell in the record state with the high threshold voltage is preferred according to the specifications of the memory system, the reverse processing may be performed on the data sequence so as to make the majority of the memory cells in the record state with the high threshold voltage.

In the memory system 1, the length of the data sequence to be processed may depend on the processing. For example, the length of the data sequence to be subjected to error correction processing may be 1 KB and the page length, which is the unit of writing, and the length of the data sequence to be subjected to the reverse processing may be 8 KB.

The counter 14 and the inverter 15 need not be independent circuits and may be replaced by the CPU 13 with a predetermined software program. When the CPU 13 provides the functions of the counter 14 and the inverter 15 by using the software program, the counter 14 and the inverter 15 may be considered to be included in the CPU 13.

<Second Embodiment>

Figure 7:
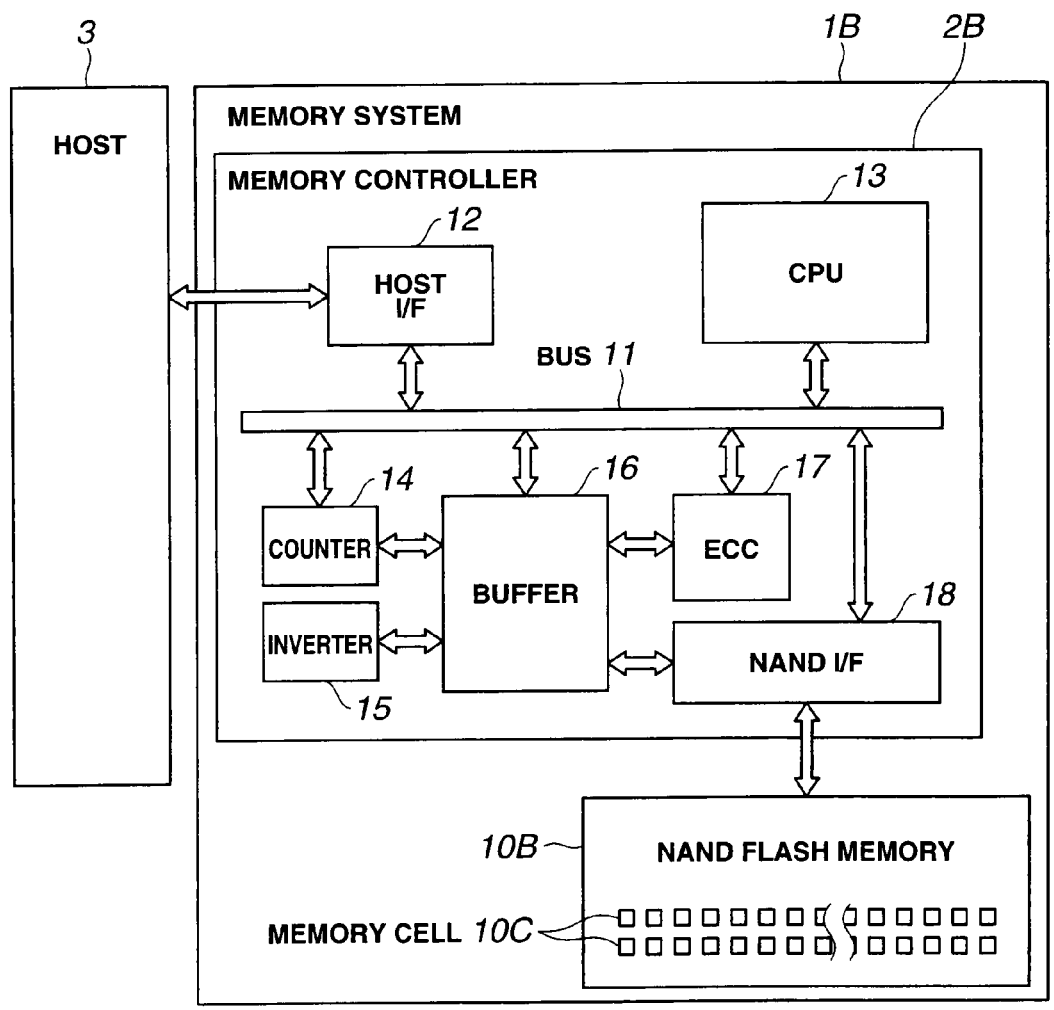
FIG. 7 is a diagram showing an outlined configuration of a memory system according to a second embodiment of the present invention.

A memory controller 2B, a memory system 1B, and a recording and reproducing method for the memory system according to a second embodiment of the present invention will be described below with reference to the drawings. FIG. 7 is a diagram showing an outlined configuration of the memory system 1B according to the embodiment. As a memory controller 2B, the memory system 1B, and the recording and reproducing method for the memory system according to the embodiment resemble the memory controller 2, the memory system 1, and the recording and reproducing method for the memory system according to the first embodiment, the same components are denoted by the same reference symbols and the description of the components is omitted.

As shown in FIG. 7, in the memory system 1B, a memory unit 10B is a so-called multivalued semiconductor memory unit. The multivalued semiconductor memory unit is the memory unit 10B configured to store a plurality of bits in one memory cell 10C. The multivalued semiconductor memory unit includes the memory cells 10C, which are the NAND-type flash memory cells. The NAND-type flash memory cell assumes record states with four or more kinds of different threshold voltages.

Figure 8:
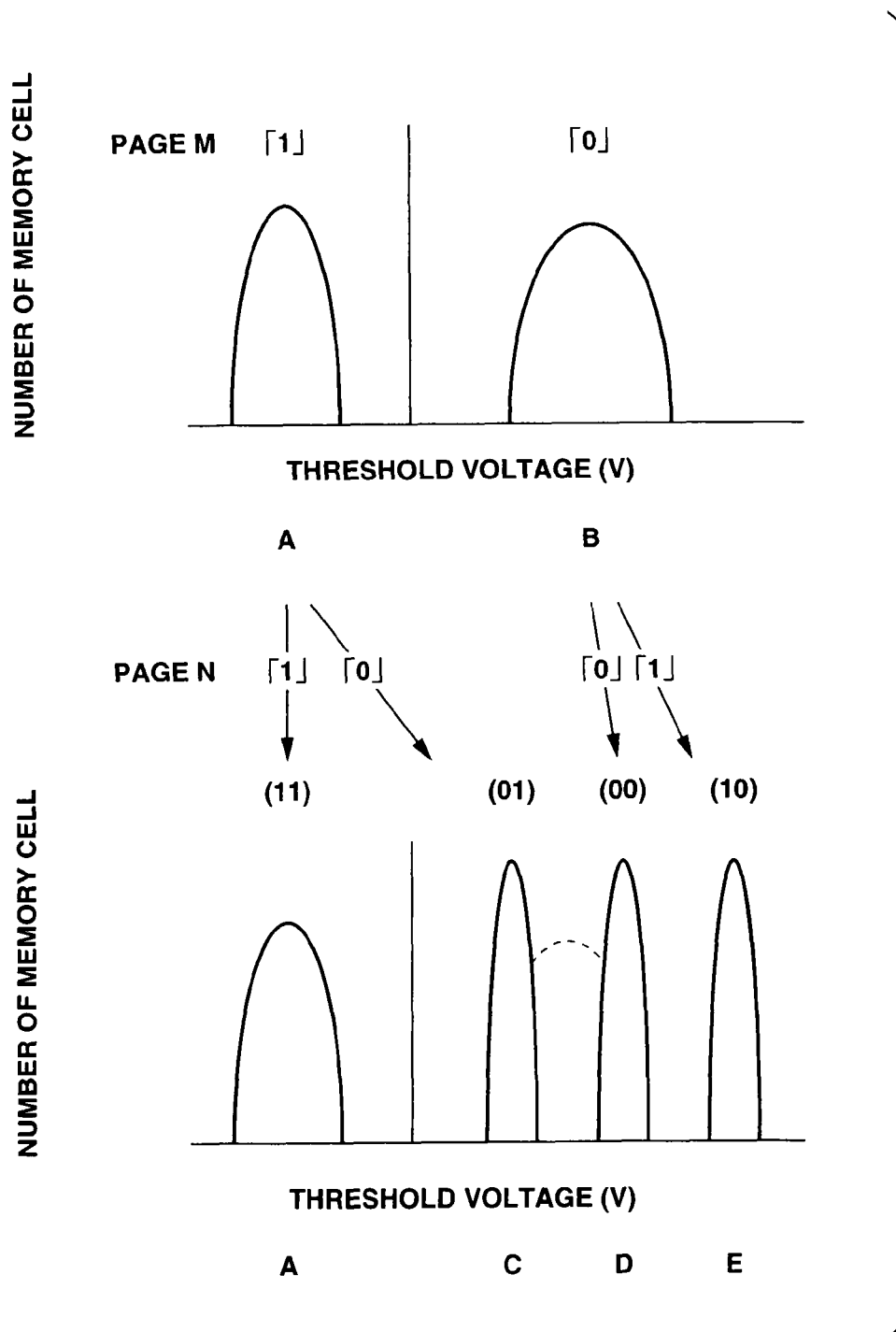
FIG. 8 is an explanatory drawing for illustrating record states of a four-value record memory system.

Now, a record operation of 2-bit data in the memory unit 10B will be described with reference to FIG. 8. Here, the memory unit 10B is a so-called four-value memory unit that stores 2-bit in one memory cell 10C. FIG. 8 is an explanatory drawing for illustrating record states of a four-value record. In FIG. 8, the axis of abscissa indicates the threshold voltage and the axis of ordinates indicates the frequency (number) of the memory cell.

In the four-value record, two data sequences are used for recording 2-bit data, i.e., any of four kinds of 2-bit data (11), (01), (00), and (10) in one memory cell 10C. It is assumed here that the data sequence to be written in the memory unit 10B first is a page m and the data sequence to be written in the memory unit 10B next is a page n, and the memory controller 2 writes the data in the page m in the memory unit 10B and then writes the data in the page n in the memory unit 10B. If the data in the page m is "1" and the data in the page n is "0", the (01) data is written in the memory cell 10C.

The upper part of FIG. 8 shows a case where the memory controller 2B has written the data in the page m in the memory unit 10B. If the data in the page m is "1", the memory cell 10C is left as a "state A", an erased state. If the data in the page m is "0", a charge is accumulated in the memory cell 10C to make the memory cell 10C in a "state B", which has the threshold voltage higher than that of the "state A".

The lower part of FIG. 8 shows a case where the memory controller 2B has written the data in the page m and then the data in the page n in the memory unit 10B. If the data in the page m is "1" and the data in the page n is also "1", the memory cell 10C is left as the "state A". If the data in the page m is "1" and the data in the page n is "0", the memory cell 10C changes from the "state A" to the "state C". If the data in the page m is "0" and the data in the page n is "0", the memory cell 10C changes from the "state B" to the "state D". If the data in the page m is "0" and the data in the page n is "1", the memory cell 10C changes from the "state B" to the "state E". The threshold voltage of the memory cell is the lowest in the "state A" in which the (11) data is recorded, and steps up in the order of the "state C" in which the (01) data is recorded, the "state D" in which the (00) data is recorded, and the "state E" in which the (10) data is recorded.

In the memory system 1B having the multivalued memory unit, if the majority of the data is to be recorded in the memory cells with the high threshold voltage, the memory system 1B takes much time in raising the threshold voltage in the record operation. When the majority of the data is to be recorded in the memory cells with the high threshold voltage, the data makes so much interference in the record operation that the surrounding memory cells may be changed by accident. That may lower the reliability such as the data retaining property of the memory system 1B.

For that reason, in the memory system 1B, the memory controller 2B performs the reverse processing on the data sequences of the page m and the page n by the inverter 15 so that the memory cells 10C by the small number are in the record states with the high threshold voltage. That is, the memory controller 2B performs the reverse processing on the data sequences so that the smallest number of the memory cells 10C are in the "state E" that is the record state with the highest threshold voltage. For the memory controller 2B, the predetermined condition that is the standard for the reverse processing is that the memory cells 10C in the "state E" that requires the highest threshold voltage are less than the memory cells in any of the other record states.

First, in the memory system 1B according to the embodiment, the counter 14 counts the number of the 2-bit data to be written in the memory cells 10C as the combinations of the data in the data sequence of the page m and the data in the data sequence of the page n which are recorded in the buffer 16. That is, the counter 14 counts the number of each of the four kinds of 2-bit data by counting the number of the "0" data or the "1" data in the data sequence of the page m and counting the number of the "0" data or the "1" data in the data sequence of the page n that is to be recorded in the combination of either of the data in the page m.

FIG. 9 shows a case where Input data that is made by the data sequence in the page m and the data sequence in the page n, each of which is formed by the bit data of 28-bit, is recorded. In the case shown in FIG. 9, the data to be recorded in the memory cell 10C (Record data) is (10), (00), (01), (10), (00) . . . from the top.

When the data shown in FIG. 9 is input, the counter 14 counts the data sequences as the data sequence of the Record data page m has the "0" data by the number of 20 (71%) and the data sequence of the page n has the "0" data by the number of 12 (43%), and with respect to the 2-bit data that is the combination of the data of the page m and the data of the page n, the Record data has the (11) data by the number of two (7%), the (01) data by the number of six (21%), the (00) data by the number of six (21%), and the (10) data by the number of 14 (50%). That is, the Record data has 14, the greatest number of the data (10) that makes the memory cells in the record state with the highest threshold voltage, i.e., the memory cells in the "state E" as shown in FIG. 8. For that reason, the inverter 15 performs the reverse processing on the data sequence so as to make the number of the memory cells in the "state E" small.

There are three methods of the reverse processing for reducing the number of the memory cells that record the (10) data such as: the method for reducing the number of the data "0" in the data sequence of the page m; the method for reducing the number of the data "1" in the data sequence of the page n; and the method for reducing both the number of the data "0" in the data sequence of the page m and the number of the data "1" in the data sequence of the page n. As shown in FIG. 8, in the memory system 1B, when the number of the data "0" in the data sequence of the page m is reduced to the minority, not only the number of the memory cells in the "state E" with the highest threshold voltage but also the number of the memory cells in the "state D" with the second highest threshold voltage are reduced. In contrast, when the number of the data "1" in the data sequence of the page n is reduced to the minority, the memory cells in the "state A" with the lowest threshold voltage are changed to the "state B" with the threshold voltage higher than that of the "state A". For that reason, the memory system 1B performs the reverse processing on the data sequence of the page m to reverse the data "0" (71%) to the data "1" but does not perform the reverse processing on the data sequence of the page n to reverse the data "0" (43%). That is, the memory system 1B applies a combination of a plurality of conditions with priorities instead of one condition as the standard for the reverse processing.

For that reason, the inverter 15 of the memory controller 2B performs the reverse processing only on the data sequence of the page m to make the memory cells in the state of (10) the minority, and set the reverse flag to "1" indicating that the reverse processing has been performed. The data sequence of the page n is not subjected to the reverse processing.

As a result, the "Recorded Data" shown in FIG. 10 is written in the memory unit 10B. Accordingly, the memory unit 10B has the memory cells in the state of (11) by the number of 14, the memory cells in the state of (01) by the number of six, the memory cells in the state of (00) by the number of six, and the memory cells in the state of (10) by the number of two.

When the data sequence is reproduced, i.e., read out the data sequence, the memory controller 2B determines whether or not to perform the re-reverse processing according to the state of the reverse flag added to the read out data sequence.

As the memory system 1B reduces the number of the memory cells which are to be in the state with the high threshold voltages and thus require a long time to be written, the memory system 1B provides a faster data recording speed and better performance. Further, the memory system 1B and the memory system that has the memory controller 2 provide not only a faster recording speed than the known memory system but also higher reliability than the known memory system. In addition, the recording and reproducing method for the memory system according to the embodiment provides higher reliability than the recording and reproducing method for the known memory system does.

In the above-described example, the inverter 15 performs the reverse processing to make the number of the memory cells in the "state E" with the highest threshold voltage small, which also makes the number of the memory cells in the "state A" with the lowest threshold voltage great. The inverter 15, however, may perform the reverse processing to make the number of the memory cells in the "state A" with the lowest threshold voltage great according to the specifications for the memory system 1B.

The inverter 15 does not perform the reverse processing on the data sequence of the page n in the above-described example. If the data sequence of the page m has been written in the memory unit 10B, however, the inverter 15 may perform the reverse processing only on the data sequence of the page n to make the number of the memory cells in the "state E" with the highest threshold voltage small.

When the buffer 16 lacks the enough capacity for recording the data sequence of the page m and the data sequence of the page n at the same time, the memory system may perform the processing according to the present invention on the data sequence of the page m and record the data sequence in the memory unit 10B, and then perform the processing according to the present invention on the data sequence of the page n and record the data sequence in the memory unit 10B. Alternatively, the memory system may perform the reverse processing only on the data sequence of either the page m or the page n.

In the case of the memory system having a multivalued memory unit such as even an eight-value memory unit or sixteen-value memory unit, when the inverter 15 performs the reverse processing on the data sequence so as to make the number of the memory cells in a predetermined record state great or small in the above-described manner, the memory system can provide better performance. For the memory system having an NAND-type flash memory unit among others, it is preferable to perform the reverse processing so as to make either the number of the memory cells with the highest threshold voltage small or the number of the memory cells with the lowest threshold voltage great.

The memory system 1B has been described by taking an example of the case where the threshold voltage of the memory cell is the lowest in the "state A" in which the (11) data is recorded, and steps up in the order of the "state C" in which the (01) data is recorded, the "state D" in which the (00) data is recorded, and the "state E" in which the (10) data is recorded. Even in the case with a different relationship between the data and the record state, the memory system can exert the advantage of the present invention by performing the reverse processing according to predetermined conditions on a basis of the magnitude of the threshold voltage.

Although the present invention has been described by taking an example of the memory system having the semiconductor memory unit, the present invention can be also applied to a magnetic recorder, a phase-change optical recorder, an optical magnetic recorder, a magnetoresistance effect recorder (MRAM) and the like that record and reproduce a digital data sequence including "0" and "1" as the memory system does.

That is, the present invention is a recording apparatus configured to record a data sequence in a memory unit and to reproduce the recorded data sequence, wherein the memory unit is made of memory cells that assume record states according to data and includes a counter configured to count the number of "0" data or "1" data in the data sequence, and an inverter configured to reverse all data in the data sequence, wherein if the inverter performs the reverse processing on the data sequence so as to make the number of the memory cells in a predetermined record state great or small based on a count of the counter in a record operation, a flag added to the data sequence is set to indicate that the reverse processing has been performed, and the inverter performs re-reverse processing on the data sequence having the flag indicating that the reverse processing has been performed in a reproducing operation.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A memory controller comprising:
   a counter configured to count the number of "0" data or "1" data in a data sequence that is to be recorded in memory cells of a semiconductor memory unit;
   an inverter configured to reverse all data in the data sequence; and
   a control unit configured to
      control to record the data in the semiconductor memory unit that is made of the memory cells and to reproduce the recorded data, wherein the memory cells assume record states with threshold voltages according to the data;
      set a flag added to the data sequence to indicate that a reverse processing has been performed, if the inverter has performed the reverse processing on the data in the data sequence so as to make the number of the memory cells in a predetermined record state great or small based on a count of the counter in a record operation; and
      perform re-reverse processing on the data in the data sequence to which the flag indicating that the inverter has performed the reverse processing is added in a reproducing operation,
      wherein the control unit controls the reverse processing of the inverter so as to make the number of the memory cells in a record state with a low threshold voltage small or to make the number of the memory cells in a record state with a high threshold voltage great.

2. A memory system comprising:
   a semiconductor memory unit that is made of memory cells that assume record states with threshold voltages according to data;
   a memory controller including:
      a counter configured to count the number of "0" data or "1" data in a data sequence;
      an inverter configured to reverse all data in the data sequence; and
      a control unit configured to
         control the memory system to record the data sequence in the semiconductor memory unit and reproduce the recorded data sequence;
         set a flag added to the data sequence to indicate that reverse processing has been performed, if the inverter has performed the reverse processing on the data sequence so as to make the number of the memory cells in a predetermined record state great or small based on a count of the counter in a record operation; and
         control to perform re-reverse processing on the data sequence to which the flag indicating that the inverter has performed the reverse processing is added in a reproducing operation,
      wherein the control unit controls the reverse processing of the inverter so as at least either to make the number of the memory cells in a record state with a low threshold voltage small or to make the number of the memory cells in a record state with a high threshold voltage great.

3. A recording and reproducing method for a memory system, comprising:
   when a data sequence is recorded in a semiconductor memory unit that is made of memory cells that assume record states with threshold voltages according to data,
   counting the number of "0" data or "1" data in the data sequence;
   performing reverse processing on the data sequence so as to make the number of the memory cells in a predetermined record state great or small based on a count counted in the counting;
   setting a flag added to the data sequence to indicate that reverse processing has been performed, if the reverse processing has been performed; and
   recording the data sequence and the flag in the semiconductor memory unit; and
   when the data sequence recorded in the semiconductor memory unit is reproduced,
   detecting a content of the flag;
   performing re-reverse processing on the data sequence, if the flag indicates that the reverse processing has been performed; and
   outputting the data sequence, wherein
   at the performing of reverse processing, the reverse processing is performed so as at least either to make the number of the memory cells in a record state with a low threshold voltage small or to make the number of the memory cells in a record state with a high threshold voltage great.

4. A recording apparatus comprising:
   a memory unit that is made of memory cells, each of which assumes a record state according to data;
   a counter configured to count the number of "0" data or "1" data in a data sequence made of the data to be recorded in the memory unit;
   an inverter configured to reverse all data in the data sequence; and
   a control unit configured to set a flag added to the data sequence to indicate that reverse processing has been performed, if the inverter has performed the reverse processing on the data sequence so as to make the number of the memory cells in a predetermined record state great or small based on a count of the counter when the data sequence is recorded in the memory unit, and to control to perform re-reverse processing on the data sequence to which the flag indicating that the inverter has performed the reverse processing is added when the data sequence is reproduced,
   wherein the control unit controls the reverse processing of the inverter so as at least either to make the number of the memory cells in a record state with a low threshold voltage small or to make the number of the memory cells in a record state with a high threshold voltage great.

* * * * *